(12) United States Patent
Tai et al.

(10) Patent No.: US 9,876,006 B2
(45) Date of Patent: Jan. 23, 2018

(54) SEMICONDUCTOR DEVICE FOR ELECTROSTATIC DISCHARGE PROTECTION

(71) Applicant: UNITED MICROELECTRONICS CORP., Hsin-Chu (TW)

(72) Inventors: Kun-Yu Tai, Tainan (TW); Li-Cih Wang, Taoyuan (TW); Tien-Hao Tang, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/188,962

(22) Filed: Jun. 21, 2016

(65) Prior Publication Data

US 2017/0323880 A1   Nov. 9, 2017

(30) Foreign Application Priority Data

May 9, 2016   (TW) .............................. 105114247 A

(51) Int. Cl.
*H01L 27/02* (2006.01)
*H01L 29/06* (2006.01)

(52) U.S. Cl.
CPC ...... *H01L 27/0277* (2013.01); *H01L 29/0623* (2013.01); *H01L 29/0653* (2013.01)

(58) Field of Classification Search
CPC ............. H01L 27/0277; H01L 29/0623; H01L 29/0653; H01L 23/60; H01L 23/62; H01L 27/0248; H01L 29/7815; H01L 29/7826
See application file for complete search history.

(56) References Cited

U.S. PATENT DOCUMENTS

| 8,643,111 B1 | 2/2014 | Jou |
| 2006/0033163 A1* | 2/2006 | Chen ................... H01L 27/0277 257/355 |
| 2014/0167105 A1* | 6/2014 | Salcedo .............. H01L 27/0262 257/140 |

* cited by examiner

*Primary Examiner* — Walter H Swanson
(74) *Attorney, Agent, or Firm* — Winston Hsu

(57) ABSTRACT

A semiconductor device for electrostatic discharge (ESD) protection includes a doped well, a drain region, a source region, a first doped region and a guard ring. The doped well is disposed in a substrate and has a first conductive type. The drain region is disposed in the doped well and has a second conductive type. The source region is disposed in the doped well and has the second conductive type, wherein the source region is separated from the drain region. The doped region is disposed in the doped well between the drain region and the source region, wherein the doped region has the first conductive type and is in contact with the doped well and the source region. The guard ring is disposed in the doped well and has the first conductive type.

9 Claims, 5 Drawing Sheets

SEMICONDUCTOR DEVICE FOR ELECTROSTATIC DISCHARGE PROTECTION

BACKGROUND OF THE INVENTION

1. Field of the Invention

The present invention relates to a semiconductor device, and more particular, to a semiconductor device for electrostatic discharge protection.

2. Description of the Prior Art

With the continued miniaturization of integrated circuit (IC) devices, the current trend is to produce integrated circuits having shallower junction depths, thinner gate oxides, lightly-doped drain (LDD) structures, shallow trench isolation (STI) structures, and self-aligned silicide (salicide) processes, all of which are used in advanced sub-quarter-micron CMOS technologies. All of these processes cause the related CMOS IC products to become more susceptible to electrostatic discharge (ESD) damage. Therefore, ESD protection circuits are built onto the chip to protect the devices and circuits of the IC against ESD damage.

Please refer to FIG. 1, which shows a schematic diagram of the electrical circuits having an ESD protection unit. In general, the main circuit 104 can provide various kinds of functions and can be triggered by supplying signals from the input pad 100. However, in some situation, when an ESD current is formed for example, the large ESD current will damage the main circuit 104. Thereafter, an ESD protection device 102 is usually provided in the IC. As long as the ESD current is applied, the ESD protection device 102 is turned on to let the ESD current pass through and further to a grounded site Vss, so the current would not damage the main circuit. 104.

However, current ESD protection device usually has a smaller holding voltage relative to the current voltage of external elements. This makes the IC device easily have a latchup issue or latchup-like issue.

SUMMARY OF THE INVENTION

In order to solve the above-mentioned issues, the present invention therefore provides a semiconductor device for electrostatic discharge (ESD) protection and which has a relatively greater holding voltage.

To achieve the purpose described above, the present invention provides a semiconductor device for electrostatic discharge (ESD) protection including a doped well, a drain region, a source region, a first doped region and a guard ring. The doped well is disposed in a substrate and has a first conductive type. The drain region is disposed in the doped well and has a second conductive type. The source region is disposed in the doped well and has the second conductive type, wherein the source region is separated from the drain region. The first doped region is disposed in the doped well between the drain region and the source region, wherein the first doped region has the first conductive type and is in contact with the doped well and the source region. The guard ring is disposed in the doped well and has the first conductive type, wherein the guard ring surrounds the drain region, the source region and the first doped region.

To achieve the purpose described above, the present invention provides a semiconductor device for electrostatic discharge (ESD) protection including a doped well, a drain region, a source region, a first doped region and a guard ring. The doped well is disposed in a substrate and has a first conductive type. The drain region is disposed in the doped well and has a second conductive type. The source region is disposed in the doped well and has the second conductive type, wherein the source region is separated from the drain region. The first doped region is disposed in the doped well between the drain region and the source region and has the first conductive type, wherein the first doped region does not connect any contact plug and is in contact with the source region. The guard ring is disposed in the doped well and has the first conductive type, wherein the guard ring surrounds the drain region, the source region and the first doped region.

According to above, the semiconductor device of the present invention includes a doped region with a complementary conductive type disposed adjacent to the emitter of a parasitic NPN BJT. The doped region may be optionally disposed beside at least one side of the emitter of the parasitic NPN BJT, or directly surrounding the emitter of the parasitic NPN BJT, thereby increasing the doped concentration of the base of the parasitic NPN BJT and increasing the holding voltage of the semiconductor device accordingly.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 2 to FIG. 4 are schematic diagrams illustrating a semiconductor device for ESD protection according to a first embodiment of the present invention; wherein FIG. 2 shows a top view of a semiconductor device for ESD protection according to the first embodiment of the present invention;

FIG. 3 shows a cross-sectional view taken along a cross line A-A' in FIG. 2;

FIG. 4 shows another cross-sectional view taken along the cross line A-A' in FIG. 2.

FIG. 5 to FIG. 6 are schematic diagrams illustrating a semiconductor device for ESD protection according to a second embodiment of the present invention; wherein:

FIG. 5 shows a top view of a semiconductor device for ESD protection according to the second embodiment of the present invention;

FIG. 6 shows a cross-sectional view taken along a cross line B-B' in FIG. 5.

FIG. 8 to FIG. 9 are schematic diagrams illustrating a semiconductor device for ESD protection according to a fourth embodiment of the present invention; wherein:

FIG. 8 shows a top view of a semiconductor device for ESD protection according to the fourth embodiment of the present invention;

FIG. 9 shows a cross-sectional view taken along a cross line C-C' in FIG. 8.

DETAILED DESCRIPTION

To provide a better understanding of the present invention, preferred embodiments will be described in detail. The preferred embodiments of the present invention are illustrated in the accompanying drawings with numbered elements.

Figure 1:
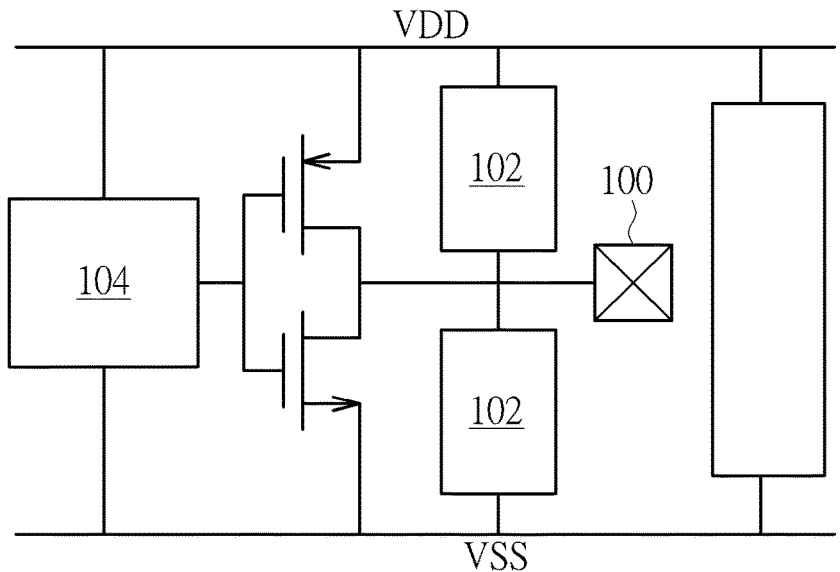
FIG. 1 is a schematic diagram illustrating a conventional electrical circuit having an ESD protection unit.
Figure 2:
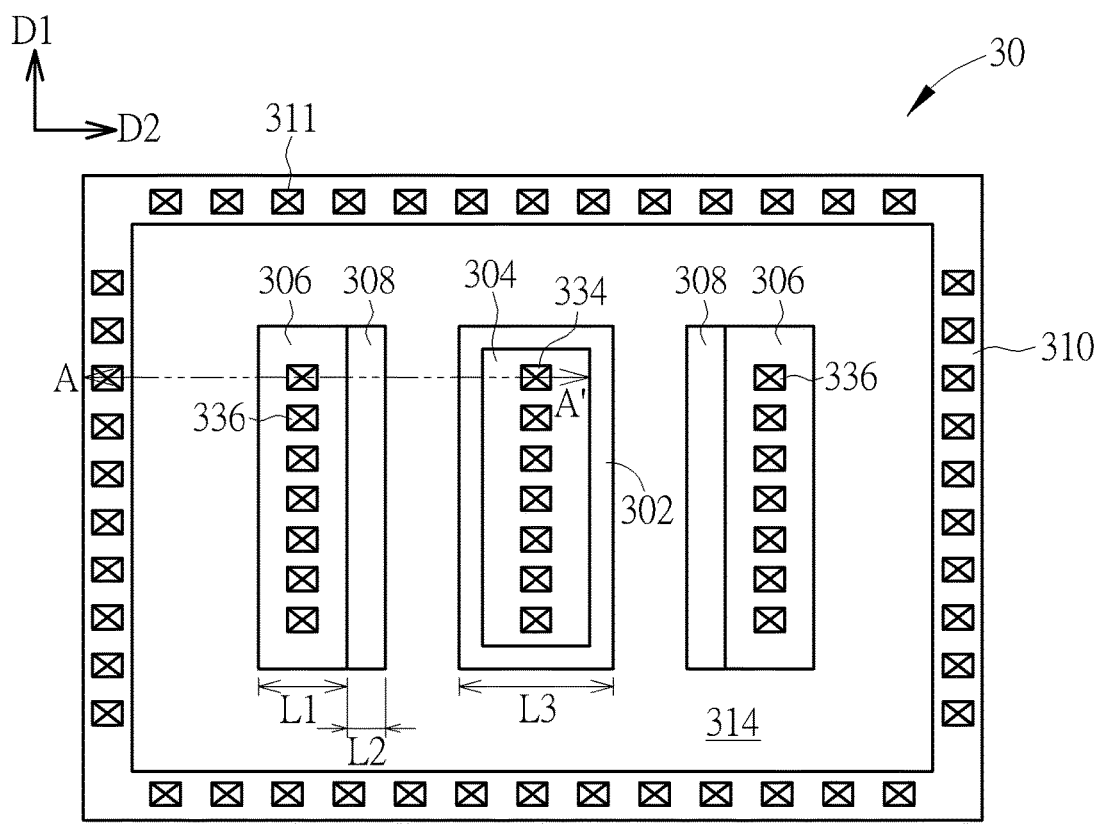
Figure 3:
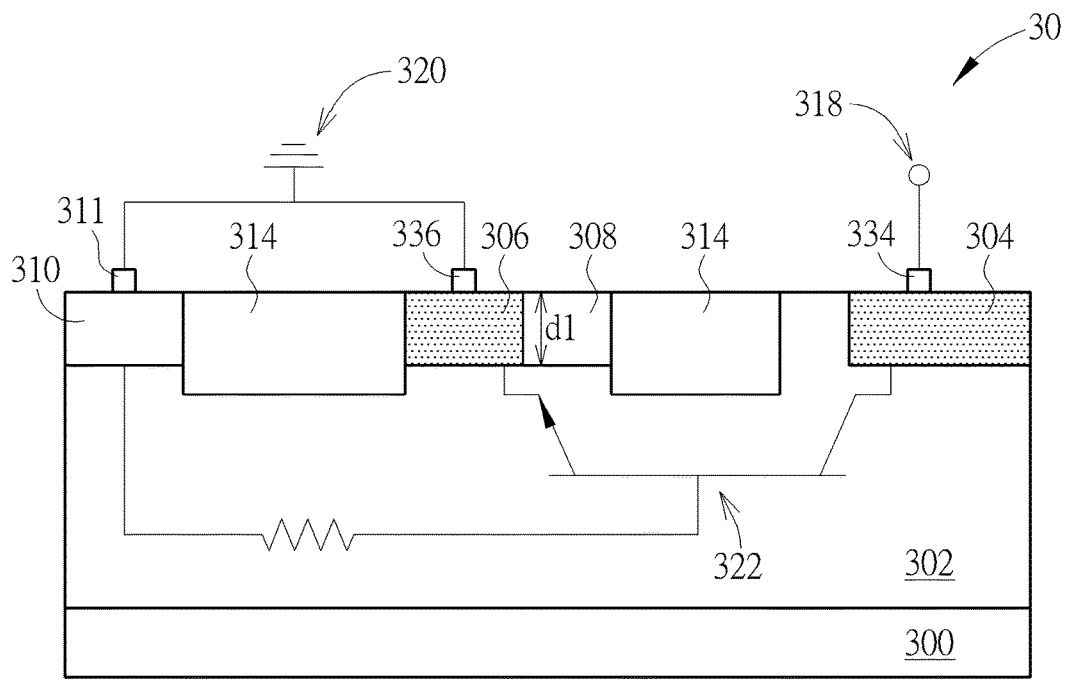
Figure 4:
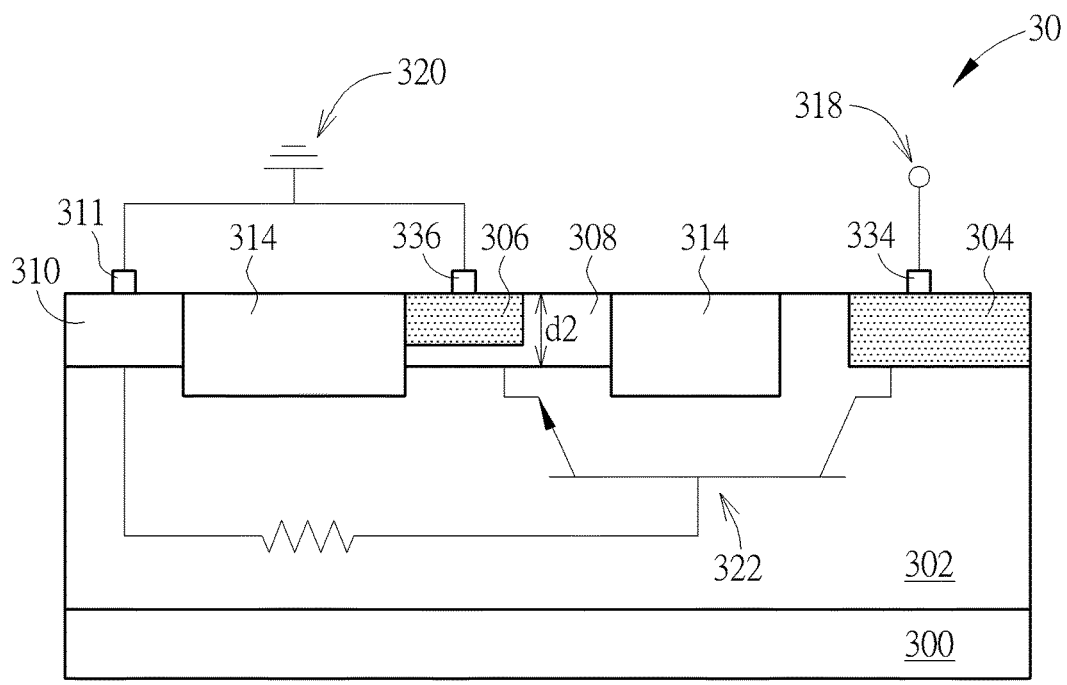

Please refer to FIG. 2 to FIG. 4, which are schematic diagrams illustrating a semiconductor device 30 for ESD protection according to the first embodiment of the present invention, wherein FIG. 2 shows a top view of the semiconductor device 30, and FIGS. 3-4 show cross sectional views taken along line AA' in FIG. 2. As shown in FIGS. 2 and 3, the semiconductor device 30 for ESD protection includes a substrate 300, a doped well 302, a drain region 304, a source region 306, a doped region 308 and a guard ring 310. The substrate 300 for example includes a silicon containing substrate, epitaxial silicon substrate or silicon-on-insulator (SOI) substrate, but is not limited thereto.

The doped well 302 is disposed in the substrate 300 and has a first conductive type, such as P type. The drain region 304, the source region 306, the doped region 308 and the guard ring 310 are all disposed in the doped well 302 and preferably not in contact with the substrate 300 directly. In other words, in the present embodiment, the doped well 302 completely surrounds the drain region 304, the source region 306, the doped region 308 and the guard ring 310.

The drain region 304 and the source region 306 have a second conductive type which is different from the first conductive type, such as N type, and the drain region 304 and the source region 306 preferably include the same doped concentration. However, in another embodiment, the drain region 304 and the source region 306 may also include P type while the doped well 302 has N type. The drain region 304 and the source region 306 include at least one contact plug disposed thereon respectively, for example contact plugs 334 and contact plugs 336 for electrically connecting the drain region 304 and the source region 306 respectively. In the present embodiment, the drain 304 is disposed between two source regions 306, and the drain region 304 and the two source regions 306 both in a strip-like-shape are arranged in parallel along a first direction D1, such as a y direction, as shown in FIG. 2. However, in another embodiment, the source region and the drain region may also have different shapes such as a circular shape, but not limited thereto. Furthermore, the semiconductor device 30 of the present invention may further include an isolation structure 314, including a shallow trench isolation (STI) or a field oxide (FOX) for example, disposed in the substrate 100 for electric isolation. For example, through the top view shown in FIG. 2, the isolation structure 314 surrounds the drain region 304 and the two source regions 306, and the guard ring 310 is disposed outside the isolation structure 314 and surrounds the isolation structure 314. On the other hand, through the cross-sectional view shown in FIG. 3, a portion of the isolation structure 314 is disposed between the source region 306 and the drain region 304, but is not in contact with the drain region 304.

The guard ring 301 has the first conductive type such as P type, and a doped concentration greater than that of the doped well 302. In the present embodiment, the guard ring 310 has a first part extending along the first direction D1 (such as the y-direction) and a second part extending along a second direction D2 different from the first direction D1 (such as the x-direction). That is, the drain region 304 and the two source regions 306 are all surrounded by the guard region 310, as shown in FIG. 2. Also, the semiconductor device 30 may further include at least one contact plug such as contact plugs 311 to electrically connect to the guard ring 310. Meanwhile, the guard ring 310 is also electrically connected to the source regions 306 through the contact plugs 311, as shown in FIG. 3.

As shown from a top view shown in FIG. 2, the doped region 308 is disposed between the drain region 304 and the source region 306, and is in contact with the isolation structure 314 and the doped well 302 underneath. In one embodiment, the doped region 308 is adjacent to the source region 306 and has, but is not limited to, a depth d1 which is the same as a depth of the source region 306, as shown in FIG. 3. However, in one embodiment, at least a portion of the doped region 308 may include a depth which is greater than the depth d1 of the source region 306. For example, the entire doped region 308 may have a depth d2 which is greater than the depth of the source region 306, as shown in FIG. 4, so as to surround a bottom portion of the source region 306 and in contact with the isolation structure 314 at two sides of the source region 306. In other words, the source region 306 may also be disposed within the doped region 308, but is not limited thereto. In another embodiment, the doped region may also have a greater depth in partial portions. For example, the doped region in a battlement-like-shape (not shown in the drawings) may be formed, in which only partial portions thereof overlap the source region 306.

It is noted that, the doped region 308 has a doped concentration which is greater than that of the doped well 302. For example, in one embodiment, the doped concentration of the doped wells 302 may be from $10^{15}$ to $10^{17}$ cm$^{-3}$, and the doped concentration of the doped region 308 may be from $10^{17}$ to $10^{21}$ cm$^{-3}$, but not limited thereto. In another embodiment, the formation of the doped region 308 may be integrated with the forming process of other elements. For example, the doped region 308 may be formed while performing a doping process for forming other function elements with the same conductive type in other active regions, such as a P+ region, a P-grade (PG) region or a P-type ESD (PESD) region. Preferably, the doped region 308 may be simultaneously formed while the P+ region and the PG region are formed, or while the P+ region and the PESD region are formed. The P+ region, the PG region and the PESD region may all include a doped concentration from $10^{17}$ to $10^{21}$ cm$^{-3}$, and a dopant which may be the same or different from each other. It is also noted that, the doped region 308 has a length L2 in the second direction, so that a ratio of the length L2 and a length L1 of the source region 306 is, but is not limited to, about 1:3 to 1:4.

Additionally, the doped region 308 is a floating structure. That is, the doped region 308 may not connect to any external input/output terminal, such as any contact plug. Specifically, while forming the contact plugs 311, 334, 336 in the subsequent process, the top surface of the doped region 308 may be covered by an interlayer dielectric layer (not shown in the drawings) and is not electrically connected to any conductive materials. Through this arrangement, the drain region 304, the doped well 302 and the source region 306 of the semiconductor device 30 may together form a parasitic NPN bipolar junction transistor (BJT) 322, in which the drain region 304 is configured as a collector of the parasitic NPN BJT 322, the doped well 302 is configured as a base of the parasitic NPN BJT 322 and the source region 306 is configured as an emitter of the parasitic NPN BJT 322, as shown in FIGS. 3 and 4. In this manner, if a large ESD current is supplied to a high voltage power site 318, the ESD current may turn on the parasitic NPN BJT 322 and the ESD current may subsequently flow through the drain region 304, the doped well 302 (including the doped region 308), the source region 306 and finally to a low voltage power site 320 such as a ground terminal, thereby avoiding the ESD current to damage the main circuit.

According to the semiconductor device 30 in the present invention, a doped region 308 having a complementary conductive type and a relatively higher doped concentration than the doped well 302 is additionally disposed beside the emitter of the parasitic NPN BJT 322 (referring to the source region 306) to increase the doped concentration of the base of the parasitic NPN BJT 322, such that the holding voltage of the parasitic NPN BJT 322 is therefore increased. Thus, the ESD tolerance of the semiconductor device 30 of the present embodiment is improved accordingly. Meanwhile, the holding voltage of the semiconductor device 30 may be directly increased by the increasing doped concentration, as well as the increasing doped area of the doped region 308. For example, while the doped concentration of the doped region 308 is about $10^{17}$ to $10^{21}$ cm$^{-3}$, the holding voltage of the semiconductor device 30 may be about 11V to 13V. On the other hand, for every increase in the doped concentration of the doped region 308 by a factor of ten, the holding voltage of the semiconductor device 30 may therefore increase by about 1V. Furthermore, while the ratio between the length L2 of the doped region 308 and the length L1 of the source region 306 in the x-direction (namely, the second direction D2) is about 1:3 to 1:4, the holding voltage of the semiconductor device 30 may also increase to about 11V to 13V.

Moreover, since the additional doped region 308 with the complementary conductive type is disposed beside the source region 306 of the semiconductor device 30, the semiconductor device 30 may obtain asymmetry source region 306 and drain region 304. In other words, the length L3 of the drain region 304 is not equal to the length L1 of the source region 306, and a ratio between the length L3 of the drain region 304 and the overall length of the source region 306 and the doped region 308 is about 3:1 to 5:1, preferably 4:1.

The following description will detail the different embodiments of the ESD protection device of the present invention. To simplify the description, the following description will detail the dissimilarities among the different embodiments and the identical features will not be redundantly described. In order to compare the differences between the embodiments easily, the identical components in each of the following embodiments are marked with identical symbols.

Figure 5:
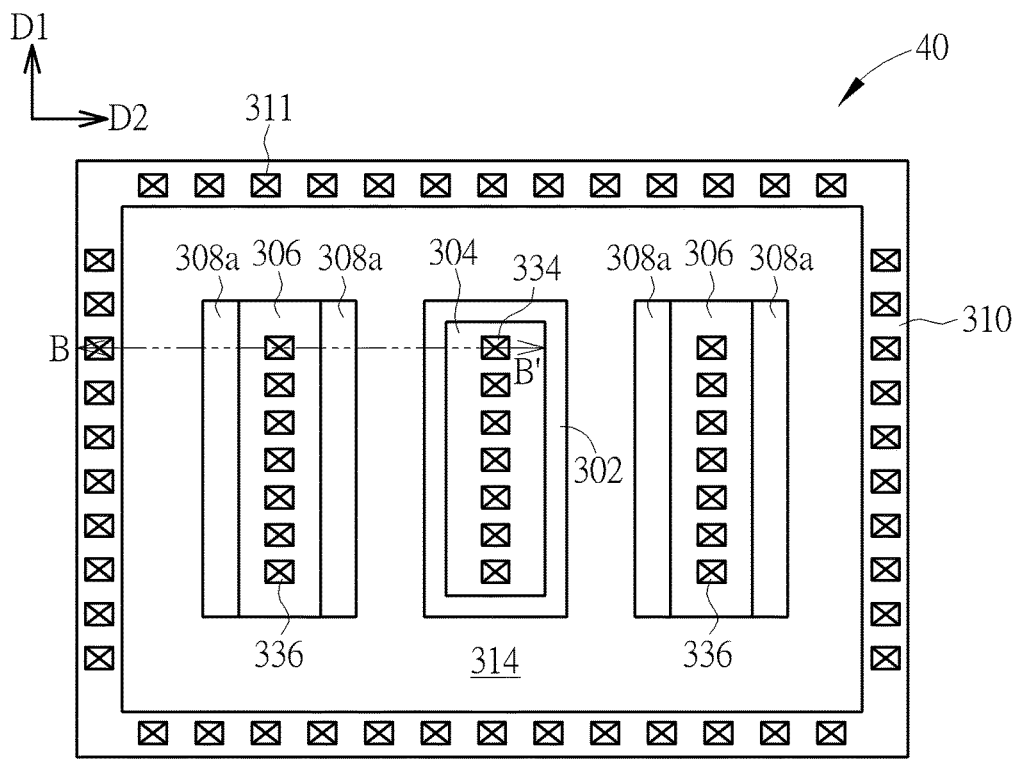
Figure 6:
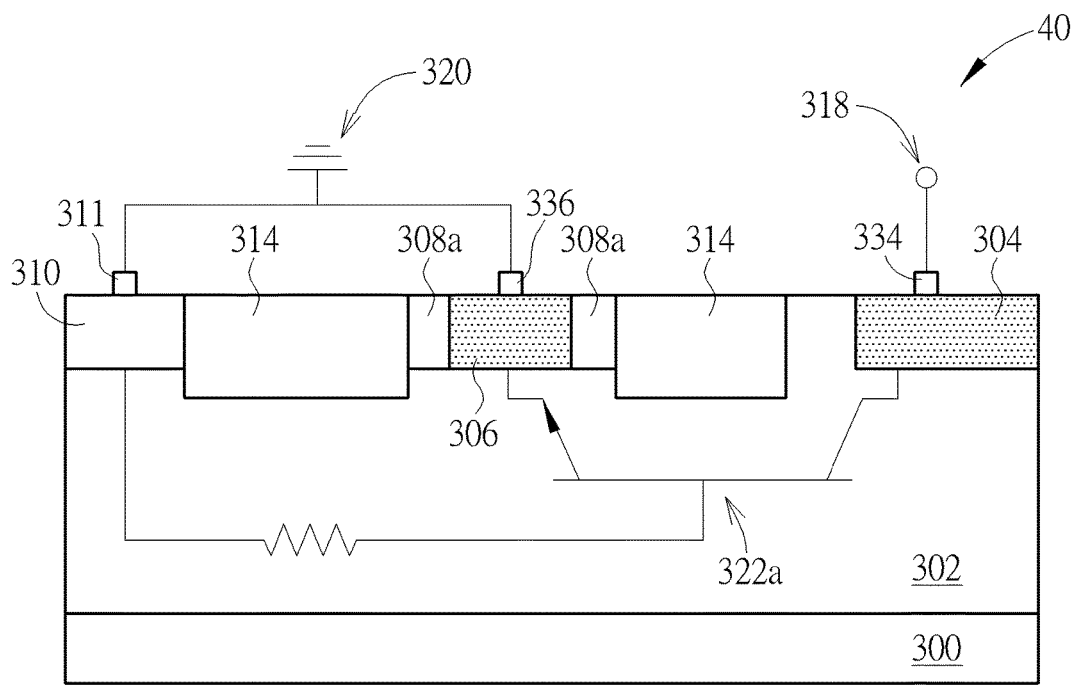

Please refer to FIGS. 5-6, which show schematic diagrams of a semiconductor device for ESD protection 40 according to the second embodiment of the present invention, in which, FIG. 5 shows a top view of the semiconductor device 40 for ESD protection and FIG. 6 shows a cross-sectional view taken along the cross line B-B' in FIG. 5. The structure of the semiconductor device 40 is substantially similar to that of the semiconductor device 30, and which includes the substrate 300, the doped well 302, the drain region 304, the source region 306 and a guard ring 310. Please note that the aforementioned elements, as well as the location thereof are substantially the same as those of the semiconductor device 30 in the first embodiment, and will not be redundantly described herein.

As shown in FIGS. 5-6, the differences between these two semiconductor devices 30, 40 are that the semiconductor device 40 includes two doped regions 308a adjacent to sides of the source region 306. That is, the source region 306 is actually disposed between the two doped regions 308a, and the two doped regions 308a are respectively disposed between the source region 306 and the guard ring 310, and between the source region 306 and the drain region 304, from the top view shown in FIG. 5. In the present embodiment, the two doped regions 308 both have the same depth d1 as the source region 306, as shown in FIG. 6, but is not limited thereto. In another embodiment, the two doped regions may also have a depth (not shown in the drawings) which is greater than the depth of the source region 306. Also, the two doped regions 308 both include a doped concentration which is greater than the doped well 302 and the formation thereof may also be integrated with the forming process of other elements, like a P+ region, a PG region and/or a PESD region in other active regions. It is noted that, the doped concentration and the dopants of the P+ region, the PG region and the PESD region are all similar to those in the first embodiment and will not be redundantly described.

According to the semiconductor device 40 of the present embodiment, both of the two doped regions 308a are floating structures. That is, the two doped regions 308a may not connect to any external input/output terminal, such as any contact plug. Specifically, while forming the contact plugs 311, 334, 336 in the subsequent process, the top surface of the two doped regions 308a may be covered by an interlayer dielectric layer (not shown in the drawings) and is not electrically connected to any conductive materials. Through such arrangement, the drain region 304, the doped well 302 and the source region 306 of the semiconductor device 40 may together form a parasitic NPN BJT 322a shown in FIG. 6. Also, since the additional doped regions 308a with the complementary conductive type and the relatively high doped concentration are both disposed at two opposite sides of the emitter of the parasitic NPN BJT 322a to increase the doped concentration of the base of the parasitic NPN BJT 322a, the holding voltage of the parasitic NPN BJT 322a is therefore increased for gaining better ESD tolerance to the semiconductor device 40.

Figure 7:
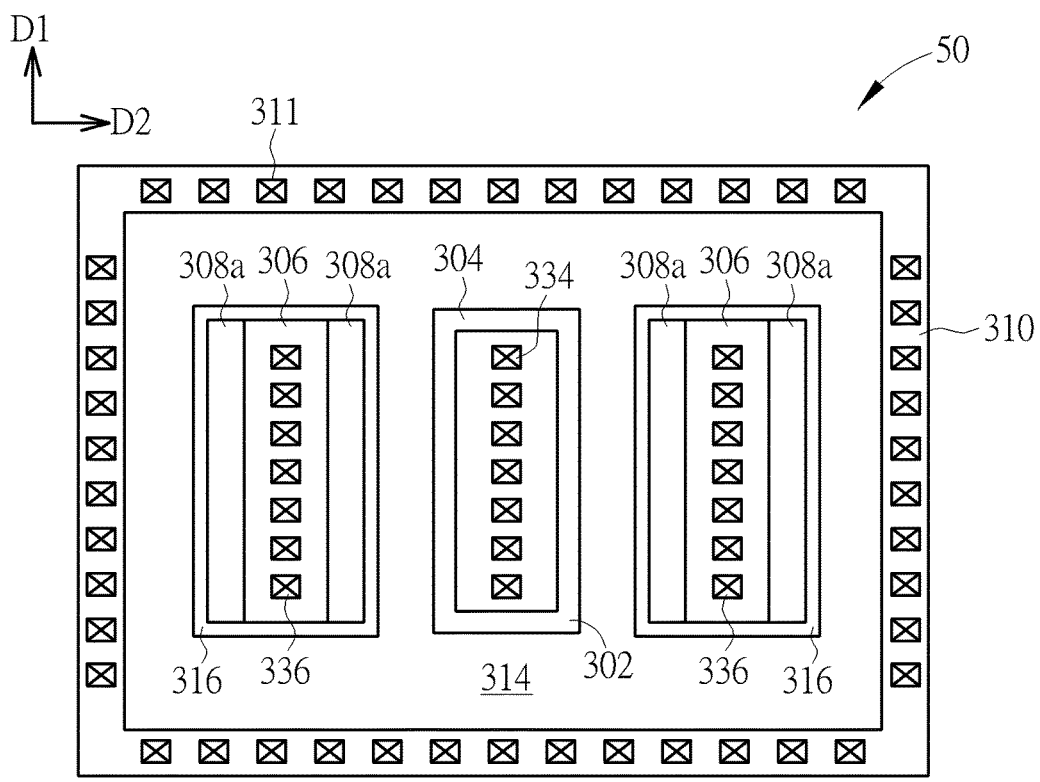
FIG. 7 is a schematic diagram illustrating a semiconductor device for ESD protection according to a third embodiment of the present invention.

Please refer to FIG. 7, which show schematic diagrams of a semiconductor device for ESD protection 50 according to the third embodiment of the present invention. The structure of the semiconductor device 50 is substantially similar to that of the semiconductor device 40 in the second embodiment, and which includes the substrate 300, the doped well 302, the drain region 304, the source region 306, the two doped regions 308a and the guard ring 310. Please note that the aforementioned elements, as well as the location thereof are substantially the same as those of the semiconductor device 40 in the second embodiment, and will not be redundantly described herein.

As shown in FIG. 7, the differences between these two semiconductor devices 40, 50 are that the semiconductor device 50 further includes a doped region 316, and the two doped regions 308a and the source region 306 are all disposed within the doped region 316. That is, the doped region 316 surrounds the two doped regions 308a and the source region 306 from the top view shown in FIG. 7. Specifically, the partial portion of entire portion of the doped region 316 may include a depth (not shown in the drawings) which is equal to or greater than the depth of the two doped regions 308a. The doped region 316 may also include a doped concentration which is greater than that of the doped well 302, but is less than that of the two doped regions 308a. For example, in one embodiment, the doped concentration of the doped wells 302 may be from $10^{15}$ to $10^{17}$ cm$^{-3}$, and the doped concentration of the doped region 316 may be from $10^{17}$ to $10^{19}$ cm$^{-3}$, and the doped concentration of the doped regions 308a may be from $10^{17}$ to $10^{21}$ cm$^{-3}$, but not limited thereto. Also, the formation of the doped region 316 may also be integrated with the forming process of other elements like a P+ region, a PG region and/or a PESD region in other active regions. For example, in one embodiment, the two doped regions 308a are simultaneously formed with the P+ region, and the doped region 316 is simultaneously formed with the PG region and the PESD region.

According to the semiconductor device 50 of the present embodiment, except for the additional doped regions 308a with the complementary conductive type are disposed at two opposite sides of the emitter of the parasitic NPN BJT 322a, the doped region 316 is further formed to surround the two doped regions 308a, so that, the doped concentration of the base of the parasitic NPN BJT 322a may be further increased accordingly. Thus, the holding voltage of the parasitic NPN BJT 322a in the present embodiment may be further increased for gaining more ESD tolerance to the semiconductor device 50.

Figure 8:
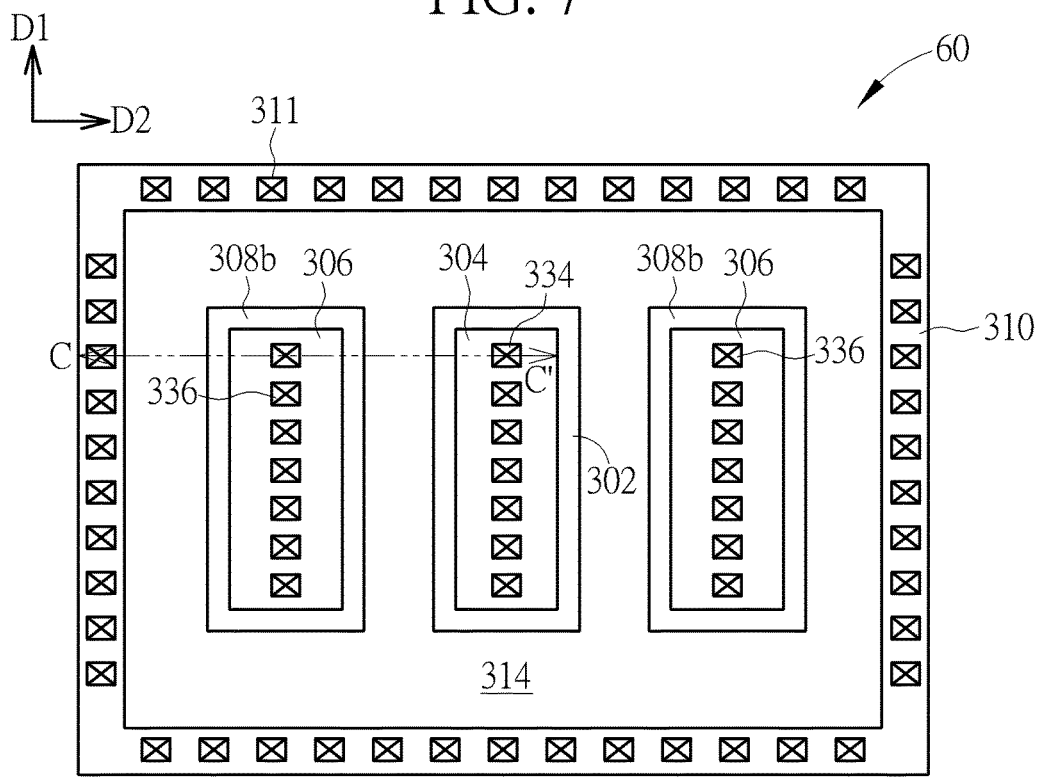
Figure 9:
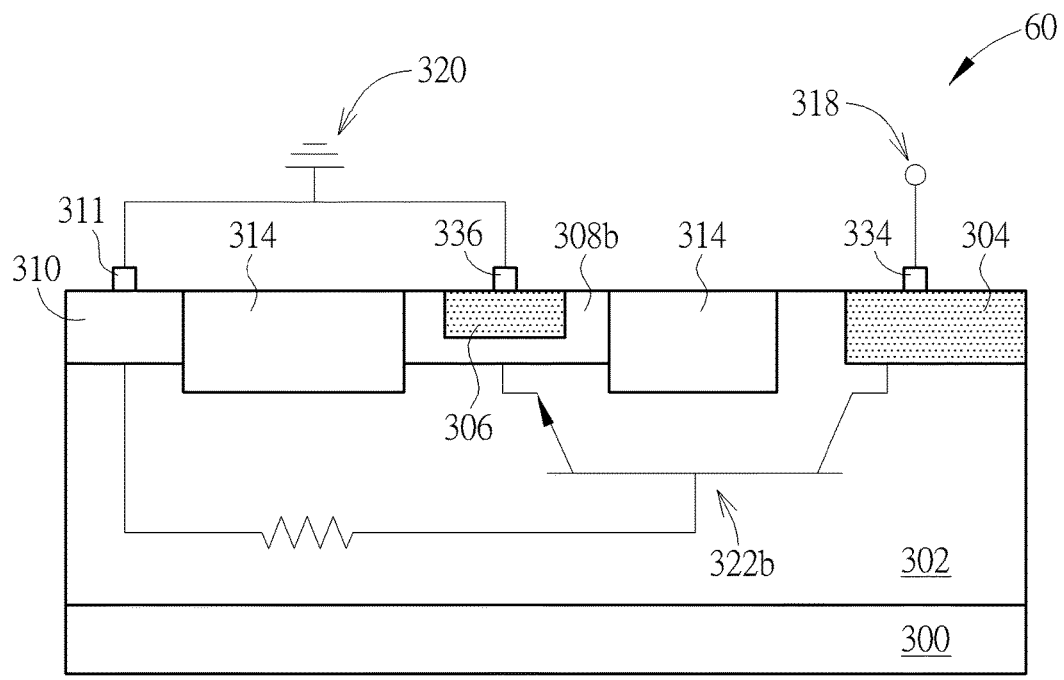

Referring to FIGS. 8-9, which show schematic diagrams of a semiconductor device for ESD protection 60 according to the fourth embodiment of the present invention, in which, FIG. 8 shows a top view of the semiconductor device 60 for ESD protection and FIG. 9 shows a cross-sectional view taken along the cross line C-C' in FIG. 8. The structure of the semiconductor device 60 is substantially similar to that of the semiconductor device 30, and which includes the substrate 300, the doped well 302, the drain region 304, the source region 306 and a guard ring 310. Please note that the aforementioned elements, as well as the location thereof are substantially the same as those of the semiconductor device 30 in the first embodiment, and will not be redundantly described herein.

As shown in FIG. 8, the differences between these two semiconductor devices 30, 60 are that the source region 306 of the semiconductor device 60 is disposed in the doped region 308b. That is, the source region 306 is completely surrounded by the doped region 308b both from the top view shown in FIG. 8 and the cross-sectional view shown in FIG. 9. Also, the doped region 308b may be simultaneously formed while the doping process of the P+ region, the PG region and/or the PESD region in other active regions is performed. Preferably, the doped region 308b is formed while the P+ region and the PESD region are formed, but is not limited thereto.

According to the semiconductor device 60 of the present embodiment, the additional doped region 308b with the complementary conductive type and the relatively higher doped concentration than the doped well 302 is disposed beside the emitter of the parasitic NPN BJT 322b to surround the emitter, as shown in FIG. 9. Thus, through disposing the doped region 308b, the doped concentration of the base of the parasitic NPN BJT 322b may be increased, and the holding voltage of the parasitic NPN BJT 322b is therefore increased for gaining more ESD tolerance to the semiconductor device 60.

Figure 10:
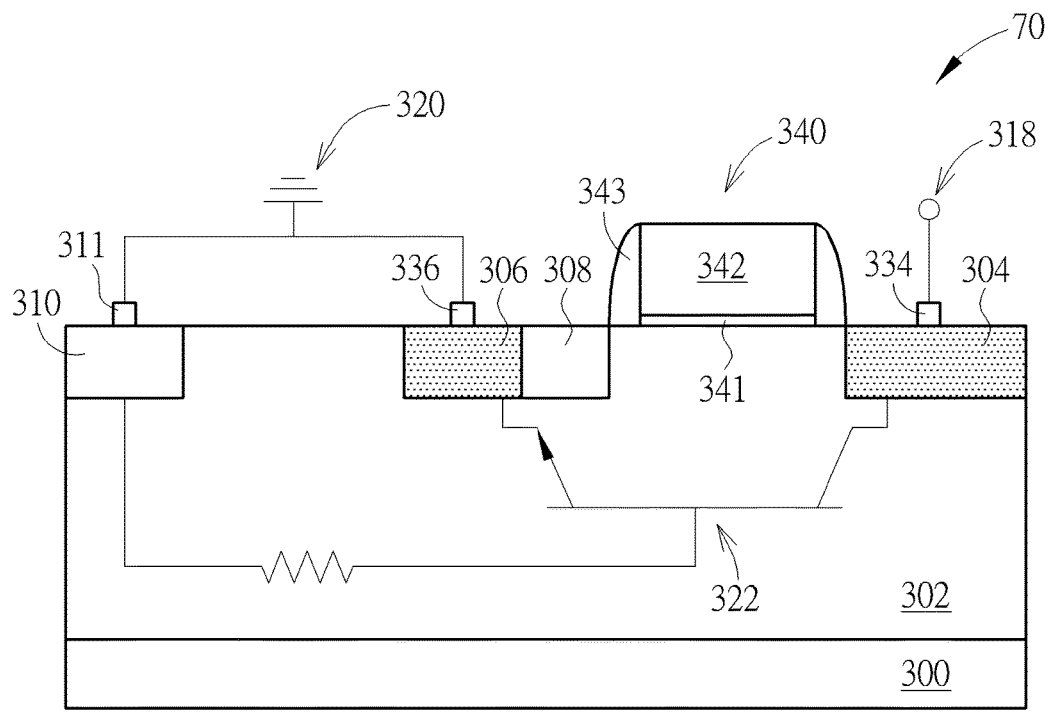
FIG. 10 is a schematic diagram illustrating a semiconductor device for ESD protection according to a fifth embodiment of the present invention.

Please refer to FIG. 10, which show schematic diagrams of a semiconductor device for ESD protection 70 according to the fifth embodiment of the present invention. The structure of the semiconductor device 70 is substantially similar to that of the semiconductor device 30 in the first embodiment, and which includes the substrate 300, the doped well 302, the drain region 304, the source region 306, the doped region 308 and the guard ring 310. Please note that the aforementioned elements, as well as the location thereof are substantially the same as those of the semiconductor device 30 in the first embodiment, and will not be redundantly described herein.

As shown in FIG. 10, the differences between these two semiconductor devices 30, 70 are that a gate structure 340 is further disposed in the semiconductor device 70, and the isolation structure is omitted in the semiconductor device 70. For example, the isolation structure is completely omitted in the present embodiment as shown in FIG. 10, or only the isolation structure disposed between the drain region 304 and the source region 306 is removed (not shown in the drawings). The gate structure 340 for example including poly-silicon or metal is disposed above the substrate 300 between the drain region 304 and the source region 306 (and/or the doped region 308). The gate structure 340 includes a gate dielectric layer 341 for example including silicon oxide, a gate electrode 342 for example including metal or doped polysilicon, and a spacer 343 surrounding the gate electrode 342 for example including silicon oxide, silicon nitride or silicon oxynitride. Thus, the doped well 302, the drain region 304, the gate structure 340 and the source region 306 may together form a gate grounded NMOS (ggNMOS) as shown in FIG. 10. It is understood that, the isolation structure of the semiconductor devices 40, 50, 60 in the aforementioned second embodiment, third embodiment and the fourth embodiment may also be omitted and replaced by the gate structure.

In summary, the semiconductor device of the present invention includes a doped region with a complementary conductive type disposed adjacent to the emitter of a parasitic NPN BJT. The doped region may be optionally disposed beside at least one side of the emitter of the parasitic NPN BJT, or directly surrounding the emitter of the parasitic NPN BJT, thereby increasing the doped concentration of the base of the parasitic NPN BJT and increasing the holding voltage of the semiconductor device accordingly. The formation of the doped region may be integrated with the forming process of other elements with the same conductive type, like a P+ region, a PG region and/or a PESD region in other active regions. It is noted that, the doped concentration and the doped area of the doped region may directly affect the increasing of the holding voltage of the semiconductor device. For example, for every increase in the doped concentration of the doped region by a factor of ten, the holding voltage of the semiconductor device may therefore increase by about 1V. Also, the length of the doped region is relative to the length of the emitter of the parasitic NPN BJT. For example, the ratio between the lengths of the doped region and the emitter is about 1:3 to 1:4, and the holding voltage of the semiconductor device may further increased while the ratio of the lengths is increased.

Although the semiconductor devices in the aforementioned embodiments are all exemplified by having a parasitic NPN BJT, the present invention is not limited thereto. It is noted that the first conductive type and the second conductive type can be swapped in other embodiments. For example, the first conductive type can be N type and the second conductive type can be P type, and the semiconductor device may include a parasitic PNP BJT or other type of diode. Through disposing a doped region with a complementary conductive type beside the emitter of the parasitic BJT, the holding voltage of a single element may be sufficiently increased. In this way, it no longer uses connected plural elements in a series to increase the entire holding voltage and the present invention is therefore beneficial to the minimization of the entire device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device for electrostatic discharge (ESD) protection, comprising:
   a doped well disposed in a substrate and having a first conductive type;
   a drain region disposed in the doped well and having a second conductive type;
   a source region disposed in the doped well and having the second conductive type, the source region being separated from the drain region;
   a first doped region disposed in the doped well between the drain region and the source region, wherein the first doped region has the first conductive type and is in contact with the doped well and the source region, wherein the first doped region has a doped concentration greater than a doped concentration of the doped well; and
   a guard ring, disposed in the doped well and having the first conductive type, the guard ring surrounding the drain region, the source region and the first doped region.

2. The semiconductor device for ESD protection according to claim 1, wherein a depth of the source region is equal to a depth of the first doped region.

3. The semiconductor device for ESD protection according to claim 1, further comprising:
   a first isolation structure disposed between the source region and the guard ring, and the first isolation structure in contact with the source region.

4. The semiconductor device for ESD protection according to claim 1, further comprising:
   a second isolation structure disposed between the source region and the drain region, wherein the second isolation structure is in contact with the first doped region.

5. The semiconductor device for ESD protection according to claim 1, wherein a ratio between a length of the first doped region and a length of the source region is 1:3 to 1:4.

6. The semiconductor device for ESD protection according to claim 1, wherein the source region and the guard ring are electrically connected to each other.

7. A semiconductor device for electrostatic discharge (ESD) protection, comprising:
   a doped well disposed in a substrate and having a first conductive type;
   a drain region disposed in the doped well and having a second conductive type;
   a source region disposed in the doped well and having the second conductive type, the source region being separated from the drain region;
   a first doped region disposed in the doped well between the drain region and the source region and having the first conductive type, wherein the first doped region does not connect any contact plug and is in contact with the source region, wherein the first doped region has a doped concentration greater than a doped concentration of the doped well; and
   a guard ring disposed in the doped well and having the first conductive type, the guard ring surrounding the drain region, the source region and the first doped region.

8. The semiconductor device for ESD protection according to claim 7, wherein a ratio between a length of the first doped region and a length of the source region is 1:3 to 1:4.

9. The semiconductor device for ESD protection according to claim 7, further comprising:
   a first isolation structure disposed between the source region and the guard ring, and the first isolation structure in contact with the source region; and
   a second isolation structure disposed between the source region and the drain region, wherein the second isolation structure is in contact with the first doped region.

* * * * *